(12) United States Patent
Tang et al.

(10) Patent No.: US 9,209,819 B2
(45) Date of Patent: Dec. 8, 2015

(54) PHASE LOCKED LOOP WITH BURN-IN MODE

(71) Applicants: Xinghai Tang, Cedar Park, TX (US); Gayathri A. Bhagavatheeswaran, Austin, TX (US); Hector Sanchez, Cedar Park, TX (US)

(72) Inventors: Xinghai Tang, Cedar Park, TX (US); Gayathri A. Bhagavatheeswaran, Austin, TX (US); Hector Sanchez, Cedar Park, TX (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 171 days.

(21) Appl. No.: 13/627,333

(22) Filed: Sep. 26, 2012

(65) Prior Publication Data

US 2014/0084974 A1 Mar. 27, 2014

(51) Int. Cl.
*H03L 7/06* (2006.01)
*H03L 7/089* (2006.01)
*H03L 7/099* (2006.01)

(52) U.S. Cl.
CPC ............ *H03L 7/0891* (2013.01); *H03L 7/0995* (2013.01)

(58) Field of Classification Search
USPC .......................................... 327/156, 157, 159
See application file for complete search history.

(56) References Cited

U.S. PATENT DOCUMENTS

| | | | |
|---|---|---|---|
| 5,471,429 A | 11/1995 | Lee et al. | |
| 5,721,504 A | 2/1998 | Sato | |
| 5,732,032 A | 3/1998 | Park et al. | |
| 6,441,660 B1 * | 8/2002 | Ingino, Jr. | 327/156 |
| 6,690,148 B2 * | 2/2004 | Harrison | 323/281 |
| 6,765,430 B2 | 7/2004 | Ando | |
| 6,885,234 B2 | 4/2005 | Ando | |
| 6,940,337 B2 | 9/2005 | Viswanathan et al. | |
| 7,123,236 B2 | 10/2006 | Ker et al. | |
| 7,498,886 B2 | 3/2009 | Lin | |
| 7,688,122 B2 * | 3/2010 | Nedovic | 327/157 |
| 7,724,078 B2 | 5/2010 | Kurd et al. | |
| 7,880,550 B2 | 2/2011 | Mai et al. | |
| 2001/0026152 A1 * | 10/2001 | Kang et al. | 324/158.1 |
| 2002/0018535 A1 * | 2/2002 | Hairapetian et al. | 375/376 |
| 2005/0030073 A1 * | 2/2005 | Wakayama et al. | 327/156 |
| 2006/0197608 A1 * | 9/2006 | Sanchez et al. | 331/16 |
| 2008/0112524 A1 * | 5/2008 | Paek et al. | 375/375 |
| 2010/0156459 A1 * | 6/2010 | Plants et al. | 326/39 |
| 2010/0244878 A1 * | 9/2010 | Yamada et al. | 324/763 |
| 2010/0271117 A1 | 10/2010 | Chou | |
| 2011/0006819 A1 * | 1/2011 | Bazes | 327/156 |
| 2011/0209021 A1 | 8/2011 | Sorensen et al. | |

OTHER PUBLICATIONS

U.S. Appl. No. 13/629643, filed Sep. 28, 2012.
U.S. Appl. No. 13/627327, filed Sep. 26, 2012.

\* cited by examiner

*Primary Examiner* — Lincoln Donovan
*Assistant Examiner* — Patrick Chen

(57) ABSTRACT

A phase locked loop having a normal mode and a burn-in mode. The logic portion is coupled to a logic power supply terminal and includes a clock receiver coupled to a phase frequency detector. The analog portion has a charge pump coupled to the phase frequency detector and to an analog power supply terminal. The analog portion also has a voltage controlled oscillator coupled to the charge pump at an analog node and to the analog power supply terminal. The phase locked loop has a node control circuit that is coupled to the analog node during the burn-in mode that controls a voltage at the analog node sufficiently below a voltage at the analog power supply terminal to avoid over-stressing the charge pump and the voltage controlled oscillator during the burn-in mode.

11 Claims, 3 Drawing Sheets

US 9,209,819 B2

PHASE LOCKED LOOP WITH BURN-IN MODE

BACKGROUND

1. Field

This disclosure relates generally to phase locked loops, and more specifically, to phase locked loops with burn-in mode.

2. Related Art

Phase locked loops (PLLs) are very important for controlling clock frequency which is a significant consideration for processors and other circuits operating at high frequencies. PLLs present an inherent difficulty in they are mostly analog in operation in an environment that has mostly digital circuits. Furthermore, during burn-in, in which the logic circuits outside the PLL are stressed by elevated voltages and temperatures, the PLL is typically deactivated by grounding its power supplies so as not to be damaged by the burn-in process. Since the PLL is deactivated, none of the analog or digital circuits are stressed during burn-in. However, it is desirable to include the PLL circuitry during the burn-in process in order to obtain improved burn-in coverage and screen out bad parts due to PLL related failures.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

During a burn-in process applied to an integrated circuit, the integrated circuit is stressed by being operated at higher operating voltages and at higher temperatures than those allowed during normal operation. After application of the burn-in process, functional testing can be applied to the integrated circuit in order to determine if any portion of the integrated circuit fails. The burn-in process helps identify those failures which would have occurred early in the lifetime of the integrated circuit. Therefore, it is desirable to also include the phase locked loops (PLLs) of an integrated circuit in the burn-in process. However, the internal circuits of the PLL may be damaged by the stresses applied during the burn-in process, and thus need to be protected during the burn-in process. For example, the internal circuits of the PLL include an analog portion whose devices may be permanently damaged with the applied voltages of the burn-in process. Furthermore, if the digital circuits (also referred to as the logic circuits) of the PLL are held at a same state for extended periods of time during the burn-in process, damage may occur to devices of the digital circuits as well. Therefore, in one embodiment, a node control circuit is used to control a voltage of an analog node of the PLL during burn-in to protect the devices in the analog portion of the PLL. In one embodiment, the analog node that is controlled by the node control circuit is a common node between a charge pump of the PLL and a voltage controlled oscillator (VCO) of the PLL, both of which are analog circuits of the PLL. Furthermore, in one embodiment, burn-in control circuitry is used to generate toggle patterns to various inputs and outputs of the digital circuitry of the PLL to ensure that a particular digital state is not held for an extended period of time. The toggle patterns may further ensure that the P-channel devices of the digital circuits of the PLL see about the same amount of stress as the N-channel devices of the digital circuits of the PLL.

Figure 1:
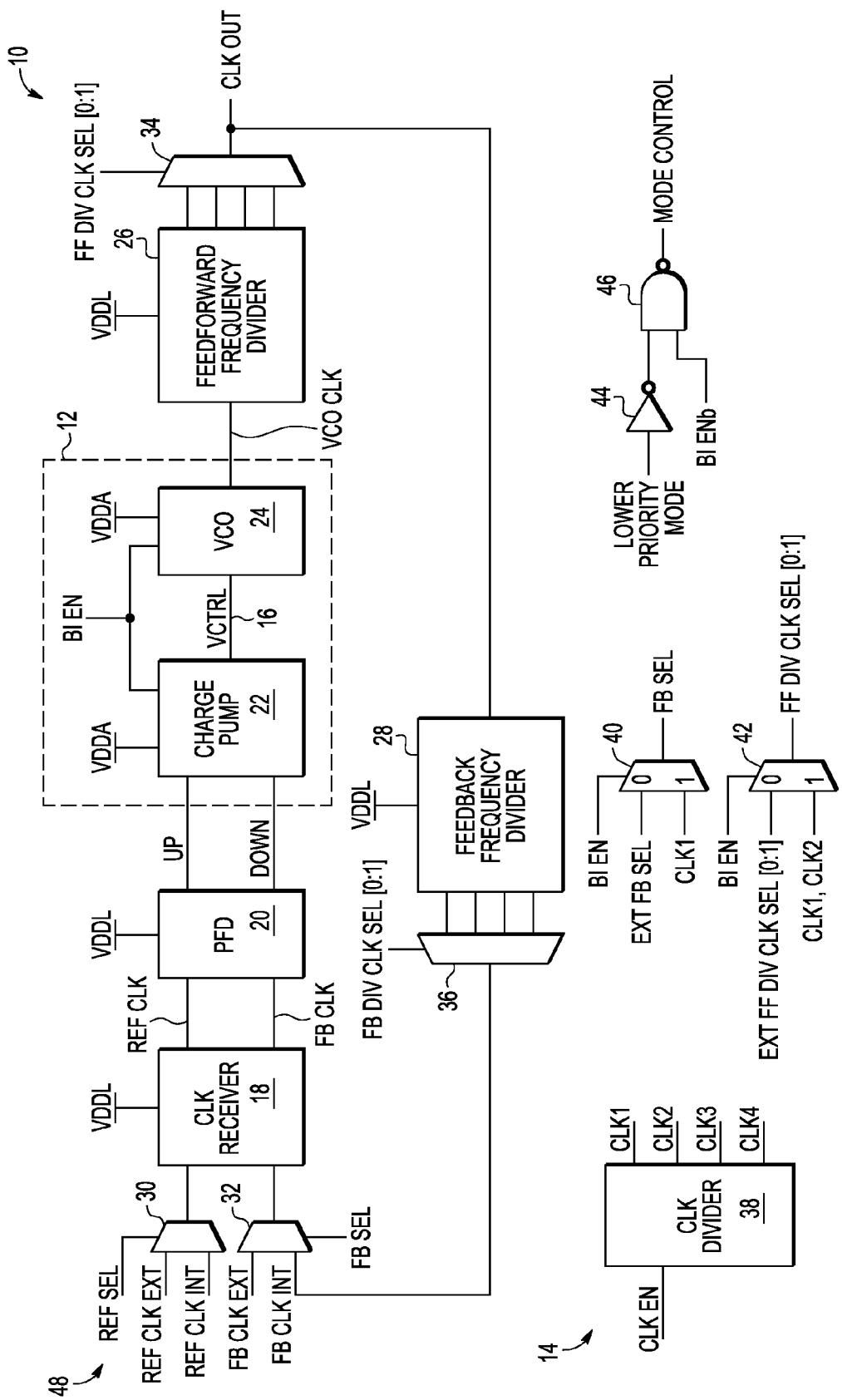
FIG. 1 is a block diagram of a system that includes a phased lock loop (PLL) and PLL burn-in control logic on a same integrated circuit, in accordance with an embodiment of the present disclosure.

Shown in FIG. 1 is a system 10 including a phase locked loop (PLL) 48 and burn-in control logic 14. PLL 48 includes a clock receiver 18 for receiving a reference input clock from a multiplexer (MUX) 30 and a feedback input clock from a multiplexer (MUX) 32 and outputs a reference signal shown as REF CLK and a feedback signal shown as FB CLK, a phase frequency detector (PFD) 20 that receives REF CLK and FB CLK and outputs an UP signal and a DOWN signal, a charge pump 22 that receives the UP and DOWN signals and outputs a voltage that is responsive to the up and down signals and shown as VCTRL, a voltage controlled oscillator (VCO) 26 that receives VCTRL and provides a VCO clock shown as VCO CLK. PLL 48 also includes a feedforward frequency divider that receives VCO CLK and provides a number of clock outputs at different frequencies derived from VCO CLK to a multiplexer (MUX) 34 which provides one of the clock outputs as the output clock shown as CLK OUT, and a feedback frequency divider 28 that provides a number of clock outputs at different frequencies derived from CLK OUT to a multiplexer (MUX) 36 which provides an output shown as FB CLK INT to MUX 32. Clock receiver 18, PFD 20, feedforward frequency divider 26, and feedback frequency divider 28 all receive a digital power supply voltage VDDL that may be an externally provided voltage which is used to power other digital logic within the same integrated circuit as PLL 48. Charge pump 22 and VCO 24 receive an analog power supply voltage VDDA that may be an externally provided voltage. Therefore, analog circuitry 12 of PLL 48 includes charge pump 22 and VCO 24 since both charge pump 22 and VCO 24 are analog circuits while clock receiver 18, PFD 20, feedforward frequency divider 26, and feedback frequency divider 28 are digital circuits (also referred to as logic circuits). Circuit node 16 is a common analog node between charge pump 22 and VCO 24 and is the circuit node which provides the output of charge pump 22, VCTRL, as an input to VCO 24. Each of charge pump 22 and VCO 24 also receive a burn-in enable signal, shown as BI EN, which, when asserted (e.g. is at a logic level one in the illustrated embodiment), indicates that system 10 is operating in a burn-in mode, such as during a burn-in process, and when negated (e.g. is at a logic level zero in the illustrated embodiment) indicates that system 10 is not operating in a burn-in mode. Note that any circuit node which is coupled to receive VDDL may be referred to as a digital power supply terminal, and any circuit node which is coupled to receive VDDA may be referred to as an analog power supply terminal.

MUX 30 receives an external reference clock, shown as REF CLK EXT, at a first input and an internal reference clock, shown as REF CLK INT, at a second input, and receives a reference clock select signal, shown as REF SEL, at a control input. When REF SEL is a logic level 0, REF CLK EXT is provided as the reference input clock to clock receiver 18, and when REF SEL is a logic level 1, REF CLK INT is provided as the reference input clock to clock receiver 18. REF CLK EXT may be an externally provided reference clock from outside system 10 such as from an off-chip source, and REF CLK INT may be a reference clock provided by other circuitry within system 10. MUX 32 receives an external feedback clock, shown as FB CLK EXT, at a first input and receives FB CLK INT from MUX 36 at a second input, and receives a feedback clock select signal, shown as FB SEL, at a control input. When FB SEL is a logic level 0, FB CLK EXT is provided as the feedback input clock to clock receiver 18, and when FB SEL is a logic level 1, FB CLK INT is provided as the feedback input clock to clock receiver 18. FB CLK EXT may be provided from other circuitry within system 10, but external to PLL 48. FB CLK INT is provided by feedback frequency divider 28 by way of MUX 36. In one embodiment, MUXes 30 and 32 may be considered to be part of clock receiver 18.

In the illustrated embodiment, MUX 34 receives four clock inputs from feedforward frequency divider 26 in which each of the four clock inputs is a clock signal derived from VCO CLK but has a different frequency. In one embodiment, the frequency of the first clock input is the frequency of VCO CLK divided by 2, the frequency of the second clock input is the frequency of VCO CLK divided by 4, the frequency of the third clock input is the frequency of VCO CLK divided by 8, and the frequency of the fourth clock input is the frequency of VCO CLK divided by 16. Alternate embodiments may have more or fewer clock inputs, depending on how many clock signals are generated from VCO CLK by feedforward frequency divider 26. MUX 34 receives a feedforward clock select signal, shown as FF DIV CLK SEL [0:1] at a control input. In the illustrated embodiment, FF DIV CLK SEL is a 2-bit signal in which each 1-bit value of FF DIV CLK SEL selects one of the four clock inputs to provide as CLK OUT and to feedback frequency divider 28. For example, if FF DIV CLK SEL has a value of 00, then the first clock is provided, if FF DIV CLK SEL has a value of 01, then the second clock is provided, if FF DIV CLK SEL has a value of 10, then the third clock is provided, and if FF DIC CLK SEL has a value of 11, then the fourth clock is provided. If only two clock inputs are received by MUX 34, only a 1-bit value is needed for FF DIV CLK SEL. Similarly, if more than four clock inputs are received by MUX 34, FF DIV CLK SEL would have more bits than 2. In one embodiment, MUX 34 may be considered to be part of feedforward frequency divider 26 in which case CLK OUT may be considered the output of feedforward frequency divider 26.

In the illustrated embodiment, MUX 36 receives four clock inputs from feedback frequency divider 28 in which each of the four clock inputs is a clock signal derived from CLK OUT but has a different frequency. In one embodiment, the frequency of the first clock input is the frequency of CLK OUT divided by 2, the frequency of the second clock input is the frequency of CLK OUT divided by 4, the frequency of the third clock input is the frequency of CLK OUT divided by 8, and the frequency of the fourth clock input is the frequency of CLK OUT divided by 16. Alternate embodiments may have more or fewer clock inputs, depending on how many clock signals are generated from CLK OUT by feedback frequency divider 28. MUX 36 receives a feedback clock select signal, shown as FB DIV CLK SEL [0:1] at a control input. In the illustrated embodiment, FB DIV CLK SEL is a 2-bit signal in which each 1-bit value of FB DIV CLK SEL selects one of the four clock inputs to provide as FB CLK INT to the second input of MUX 32. For example, if FB DIV CLK SEL has a value of 00, then the first clock is provided, if FB DIV CLK SEL has a value of 01, then the second clock is provided, if FB DIV CLK SEL has a value of 10, then the third clock is provided, and if FB DIV CLK SEL has a value of 11, then the fourth clock is provided. If only two clock inputs are received by MUX 36, only a 1-bit value is needed for FB DIV CLK SEL. Similarly, if more than four clock inputs are received by MUX 36, FB DIV CLK SEL would have more bits than 2. In one embodiment, MUX 36 may be considered to be part of feedback frequency divider 28 in which case FB CLK INT to the second input of MUX 32 may be considered the output of feedback frequency divider 28.

Burn-in control logic 14 includes a clock (CLK) divider 38 which receives an input clock, shown as CLK IN and provides four output clocks: CLK1, CLK2, CLK3, and CLK4. CLK IN is a clock signal which is used to generate toggling patterns for the select signals which control MUXes 30, 32, 34, and 36 during burn-in (when BI EN is asserted). In one embodiment, CLK IN is a clock signal that is provided solely for the use by burn-in control logic 14. In the illustrated embodiment, each of CLK1, CLK2, CLK3, and CLK4 is a clock derived from CLK IN and having a different frequency than CLK IN. For example, CLK1 may have the frequency of CLK IN divided by 2, CLK2 may have the frequency of CLK IN divided by 4, CLK3 may have the frequency of CLK IN divided by 8, and CLK4 may have the frequency of CLK IN divided by 16. Other frequency divide values may be used, and more or fewer clock signals may be generated by CLK divider 38 depending on the patterns needed for the MUX select signals.

In burn-in control logic 14, multiplexer (MUX) 40 receives an external feedback select signal, shown as EXT FB SEL, at a first input, and CLK1 at a second input, and BI EN at a control input. When BI EN is a logic level zero, EXT FB SEL is provided as FB SEL to the control input of MUX 32, and when BI EN is a logic level one, CLK1 is provided as FB SEL to the control input of MUX 32. Multiplexer (MUX) 42 receives a 2-bit value of an external feedforward clock select signal, shown as EXT FF DIV CLK SEL [0:1], at a first 2-bit input, and receives CLK1 at a first bit of a second 2-bit input and CLK2 at a second bit of the second 2-bit input. When BI EN is a logic level zero, EXT FF DIV CLK SEL [0:1] is provided as FF DIV CLK SEL [0:1] at the control input of MUX 34, and when BI EN is a logic level one, CLK1 is provided as one bit of FF DIV CLK SEL (e.g. FF DIV CLK SEL[0]) and CLK2 is provided as the other bit of FF DIV CLK SEL (e.g. FF DIV CLK SEL[1]). Note that, as will be described below, additional MUXes, such as MUXes 40 and 42, may be included in burn-in control logic 14 to provide REF SEL to the control input of MUX 30 and to provide FB DIV CLK SEL [0:1] to the control input of MUX 32 in an analogous manner to MUXes 40 and 42, in which each additional MUX is controlled by BI EN to provide either an external select signal to MUXes 30 and 36, or an appropriate one or more clock signals from CLK divider 38.

Burn-in control logic 14 may also include override logic to ensure that burn-in mode (indicated by BI EN) takes priority over any other lower priority mode. For example, a lower priority mode indicator may be provided to an input of an inverter 44 whose output is provided a first input of a NAND gate 46, and the complement of BI EN, shown as BI ENB, to a second input of NAND 46. The output of NAND 46 provides a mode control which may be used to configure various elements of PLL 48 accordingly. For example, if BI EN is asserted, then BI ENB is a logic level zero and mode control will be asserted regardless of the value at the first input of NAND gate 46. In this manner, if mode control is asserted, then BI EN can be ensured to configure PLL 48, as will be described below, whereas if mode control is not asserted, then the lower priority mode can configure PLL 48 as needed for its operation. Such a lower priority mode may be, for example, a scan test mode. That is, if both burn-in and scan modes are both occurring, PLL 48 should be configured for burn-in mode rather than for scan mode since burn-in mode has priority. That is, in one embodiment, due to the protection from damage needed by PLL 48 during burn-in, PLL 48 must be configured for burn-in regardless of any other mode which may be occurring during the burn-in process.

During normal operation of PLL 48 (also referred to as the normal mode of PLL 48), in which BI EN is negated (a logic level zero in the illustrated embodiment), PLL 48 outputs a clock signal, CLK OUT for use by other logic within system 10. The frequency of CLK OUT is set by the design of PLL 48 and may be further controlled by a number of PLL external controls (which may be received by way of input pins). For example, during normal operation, FB SEL at the control input of MUX 32 is provided by EXT FB SEL. EXT FB SEL may be a signal provided from an external source at an input pin of PLL 48 which selects one of FB CLK EXT or FB CLK INT for use during normal operation, based on the design of system 10 and PLL 48. Similarly, although not explicitly illustrated in FIG. 1, during normal operation in which BI EN is negated, REF SEL at the control input of MUX 32 is provided by an external reference select signal which may be a signal provided from an external source at another input pin of PLL 48 which selects one of REF CLK EXT or REF CLK INT for use during normal operation, based on the design of system 10 and PLL 48. During normal operation of PLL 48, in which BI EN is negated, FF DIV CLK SEL[0:1] at the control input of MUX 34 is provided by EXT FF DIV CLK SEL. EXT FF DIV CLK SEL may be another signal provided from an external source at 2 input pins of PLL 48 which selects one of the four clocks provided by feedforward frequency divider for use during normal operation, based on the design of system 10 and PLL 48. Similarly, although not explicitly illustrated in FIG. 1, during normal operation in which BI EN is negated, FB DIV CLK SEL[0:1] at the control input of MUX 36 is provided by an external feedback clock select signal which may be a signal provided from an external source at another 2 input pins of PLL 48 which selects one of the four clocks provided by feedback frequency divider 28 for use during normal operation, based on the design of system 10 and PLL 48.

Therefore, during normal operation, in normal PLL form, clock receiver 18 receives a reference clock (from MUX 30) and a feedback clock (from MUX 32) and provides REF CLK and FB CLK to PFD 20 that responds by asserting either the UP signal or the DOWN signal to charge pump 22. Charge pump 22 either increases or decreases its output VCTRL at analog node 16 in response to the UP signal being asserted or the DOWN signal being asserted, respectively. VCO, in response to VCTRL, responds by providing VCO CLK at the frequency indicated by voltage signal VCTRL. That is, as VCTRL increases, the frequency of VCO CLK increases, and as VCTRL decreases, the frequency of VCO CLK decreases. Feedforward frequency divider 26 divides VCO CLK and MUX 34 provides the divided clock selected by the corresponding input pin to PLL 48 as CLK OUT. CLK OUT is then used by logic in system 10 to perform logic operations. That is, during a normal mode, PLL 48 operates to provide a clock signal, CLK OUT, for use within system 10.

Figure 2:
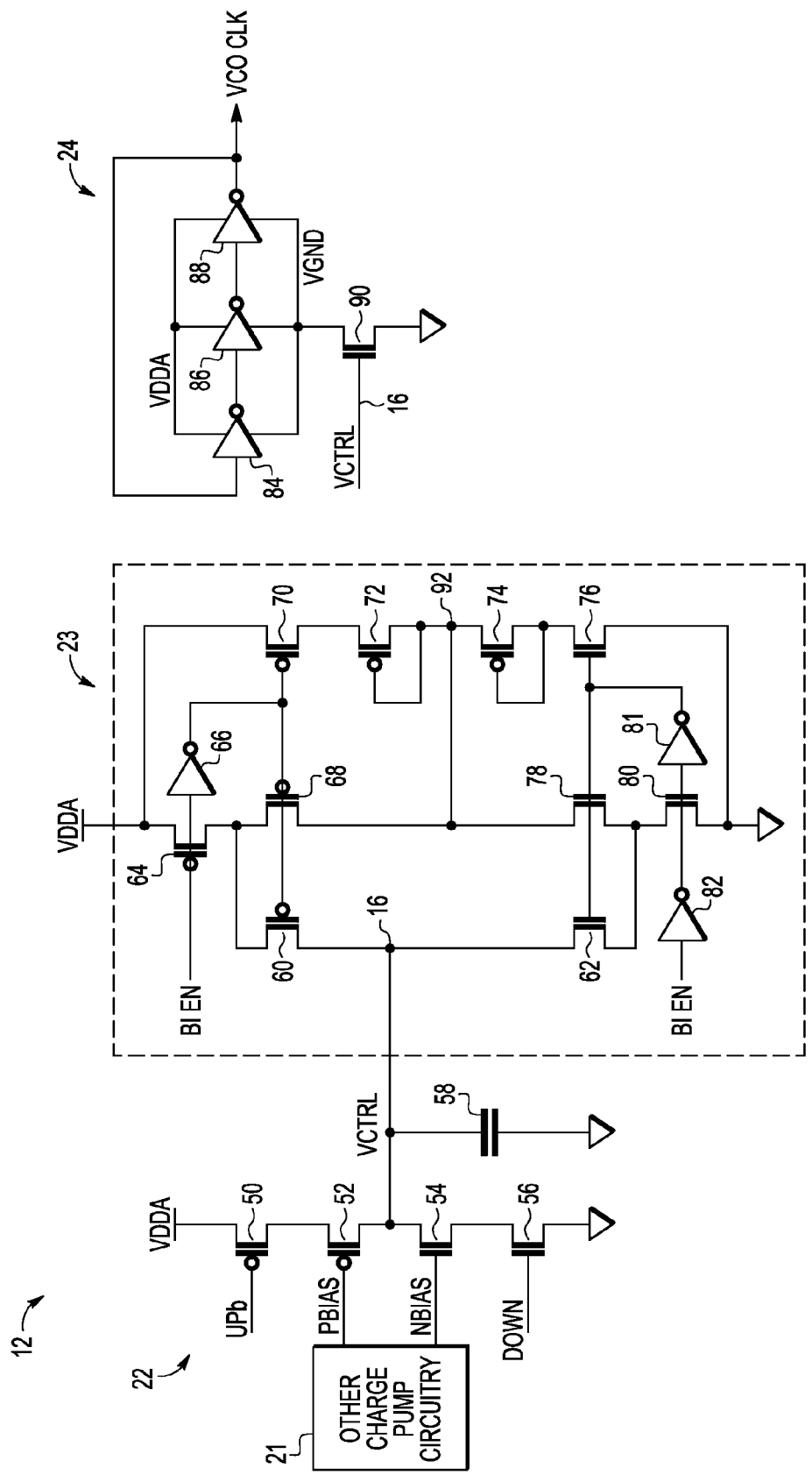
FIG. 2 is a schematic diagram of an portion of the of the PLL of FIG. 1, in accordance with one embodiment of the present disclosure.

FIG. 2 illustrates, in schematic form, further details of analog portion 12 of PLL 48, in accordance with one embodiment of the present disclosure. Charge pump 22 includes a p-channel transistor 50 having a first current electrode coupled to VDDA, a control electrode coupled to receive the complement signal of the UP signal, shown as UPb, and a second current electrode. Charge pump 22 also includes a P-channel transistor 52 having a first current electrode coupled to the second current electrode of transistor 50, a control electrode coupled to receive a bias voltage, PBIAS, and a second current electrode coupled to analog node 16. Charge pump 22 also includes an N-channel transistor 54 having a first current electrode coupled to analog node 16, a control electrode coupled to receive a bias voltage, NBIAS, and a second current electrode, and an N-channel transistor 56 having a first current electrode coupled to the second current electrode of transistor 54, a control electrode coupled to receive the DOWN signal, and a second current electrode coupled to ground. Note that the UPb signal can be obtained from the UP signal of PFD 20 with an inverter, and the DOWN signal is also received from PFD 20. Charge pump 22 also includes other charge pump circuitry 21. Other charge pump circuitry 21 may includes a start-up circuit and an analog bias generation circuit, which may provide PBIAS and NBIAS generated by current mirror arrangements. In one embodiment, transistors 50, 52, 54, and 56 represent the output stage of charge pump circuitry 22. Charge pump 22 also includes a capacitor 58 having a first terminal coupled to analog node 16 and a second terminal coupled to ground. Note that analog node 16 provides VCTRL. Any known circuitry may be used within other charge pump circuitry 21. Furthermore, in alternate embodiments, charge pump 22 may use different charge pump circuitry configurations to control VCTRL.

During normal operation of PLL 48, if PFD 20 determines, based on the phase comparison between REF CLK and FB CLK that an increased frequency of FB CLK is needed, PFD 20 asserts the UP signal, in which case, UPb turns on transistor 50 to provide a current path from VDDA to node 16, thus increasing the voltage of VCTRL. If PFD 20 determines that a decreased frequency of FB CLK is needed, PFD 20 asserts the DOWN signal, in which case, DOWN turns on transistor 56 to provide a current path from node 16 to ground, thus decreasing the voltage of VCTRL.

VCO 24 includes inverters 84, 86, and 88 coupled between VDDA and node VGND. Inverter 84 has an output coupled to an input of inverter 86, inverter 86 has an output coupled to an input of inverter 88, and an output of inverter 88 provides VCO CLK and is also coupled to an input of inverter 84. VCO 24 also includes an N-channel transistor 90 having a first current electrode coupled to VGND, a control electrode coupled to node 16 and thus receives VCTRL, and a second current electrode coupled to ground. Therefore, note that, during normal operation of PLL 48, as VCTRL increases in voltage, transistor 90 pulls VGND closer to ground, thus increasing the supply voltage over series-connected inverters 84, 86, and 88, which results in an increase in speed (i.e. increase in frequency) of VCO CLK. However, during normal operation, as VCTRL decreases in voltage, transistor 90 draws less current, thus decreasing the supply voltage over series-connected inverters 84, 86, and 88, which results in a decrease in speed (i.e. decrease in frequency) of VCO CLK. During normal operation of PLL 48, VCO CLK is used to derive CLK OUT which is feedback to clock receive 18 and PFD 20 to continuously control the frequency of CLK OUT.

Analog portion 12 also includes an analog node control circuit 23 coupled to analog node 16. Node control circuit 23 includes a P-channel transistor 64 having a first current electrode coupled to VDDA, a control electrode coupled to receive BI EN, and a second current electrode, a P-channel transistor 60 having a first current electrode coupled to the second current electrode of transistor 64, a control electrode, and a second current electrode coupled to analog node 16, a P-channel transistor 68 having a first current electrode coupled to the second current electrode of transistor 64, a control electrode coupled to the control electrode of P-channel transistor 60, and a second current electrode coupled to a circuit node 92, a P-channel transistor 70 having a first current electrode coupled to VDDA, a control electrode coupled to the control electrode of transistor 68, and a second current electrode, and a P-channel transistor 72 having a first current electrode coupled to the second current electrode of transistor 70, a control electrode coupled to circuit node 92, and a second current electrode coupled to circuit node 92. Node control circuit 23 also includes an N-channel transistor 62 having a first current electrode coupled to analog node 16, a control electrode, and a second current electrode, an N-channel transistor 78 having a first current electrode coupled to circuit node 92, a control electrode coupled to the control electrode of transistor 72, and a second current electrode coupled to the second current electrode of transistor 62, an N-channel transistor 80 having a first current electrode coupled to the second current electrode of transistor 78, a control electrode coupled to receive a complementary signal of BI EN from an output of an inverter 82 and coupled to an input of an inverter 81, and a second current electrode coupled to ground, an N-channel transistor 76 having a first current electrode, a control electrode coupled to the control electrode of transistor 78 and an output of inverter 81, and a second current electrode coupled to ground, and an N-channel transistor 74 having a first current electrode coupled to circuit node 92, a control electrode coupled to the first current electrode of transistor 76, and a second current electrode coupled to the first current electrode of transistor 76. Node control circuitry 23 also includes inverter 82 which has an input coupled to receive BI EN, an inverter 66 having an input coupled to a control electrode of transistor 64 and an output coupled to the control electrodes of transistors 68 and 70, and an inverter 81 having an input coupled to the control electrode of transistor 80 and an output coupled to the control electrodes of transistors 78 and 76. Note that node control circuit 23 can be included within charge pump 22 or within VCO 24 or as a separate circuit within PLL 48.

During normal operation of PLL 48, in which BI EN is deasserted, transistors 60, 68, 70, 62, 78, and 76 are all off, thus decoupling node control circuit 23 from analog node 16. Therefore, during normal mode of PLL 48, circuit 23 does not affect or control analog node 16. However, as will be described below, during burn-in mode, node control circuit 23 is coupled to analog node 16 to control a voltage, VCTRL, at analog node 16 to be sufficiently below a voltage value of VDDA to avoid over-stressing charge pump 22 and VCO 24 during burn-in.

During burn-in mode, when BI EN is asserted, PLL 48 no longer operates functionally as a PLL. Furthermore, other logic within system 10 ignores CLK OUT since it does not provide an appropriate output. During burn-in mode, VDDA and VDDL are set at higher voltage values than allowed during normal operation, thus stressing PLL 48. Furthermore, during burn-in mode, system 10 is operated at higher temperatures than allowed during normal operation. For example, in one embodiment, during normal operation, VDDL may have an allowable value of between 0.8 and 1.05 volts and VDDA may have an allowable value of between 1.65 and 1.89 volts, and system 10 may operate at an allowable temperature of between −40 and 125 degrees Celsius, and during burn-in, VDDL may be set to a voltage of at least 1.3 volts, VDDA may be set to a voltage of at least 2.2 volts, and system 10 may be made to operate in a furnace at a temperature of at least 150 degrees Celsius. However, with VDDA set at a higher voltage value during burn-in mode, VCTRL can swing between voltage values that are either too high or too low thus possibly over-stressing one or more devices of analog portion 12. Also, based on the leakage of charge pump devices (such as transistors 50, 52, 54, and 56), it is unknown at what voltage value VCTRL will end up during burn-in. VCTRL may settle at one extreme (close the voltage level of VDDA) or the other extreme (close to ground). If VCTRL goes up to a level close to VDDA during burn-in, which is at a higher voltage level than allowed during normal operation, then one or more transistors of charge pump 22 may be over-stressed and permanently damaged. Also, if VCTRL goes too high (such as to a level close to VDDA), then transistors of VCO 24, such as those within inverters 84, 86, and 88, may be over-stressed and permanently damaged due to the overly large voltage drop between VDDA and VGND caused by a high value of VCTRL at the control electrode of transistor 90. Therefore, during burn-in mode, node control circuit 23 controls VCTRL at analog node 16 such that VDTRL remains sufficiently below the higher voltage level of VDDA so as to avoid over-stressing transistors of charge pump 22 and VCO 24.

Referring to node control circuit 23 of FIG. 2, during burn-in mode in which BI EN is asserted (e.g. a logic level high), transistors 60, 68, 70, 62, 78, and 76 are turned on (and transistors 64 and 80 are turned off). This creates a current path from VDDA, through transistors 70 and 72, to circuit node 92, and through transistors 68 and 60 to analog node 16, and a circuit path from node 16, through transistors 62, 78, through circuit node 92, and through transistors 74 and 76 to ground. These current paths allow circuit node 92 to control the voltage level of analog node 16 (and thus control VCTRL). Therefore, circuit node 92 may also be referred to as a control node. Transistors 60 and 62 (and transistors 68 and 78) operate as a transmission gate which is coupled between node 16 and node 92 and which is enabled in response to BI EN. That is, when BI EN is asserted, the transmission gate is enabled (e.g. turned on) and when BI EN is negated, the transmission gate is disabled (e.g. turned off) and is in a high impedance state. Note that circuit 23 creates a voltage divider in which the voltage at node 92 remains at a fixed voltage between VDDA and ground. In the illustrated embodiment, since diode-connected transistors 72 and 74 are matched, and transistors 70 and 76 can be matched, a voltage divider is created such that node 92 remains at a fixed voltage of one half of VDDA (i.e. VDDA/2). In this manner, analog node 16 remains at VDDA/2. Therefore, even though, during burn-in, VDDA is placed at higher voltages than allowed during normal operation (i.e. during normal mode) and which could over-stress the transistors of charge pump 22 and VCO 24, the voltage at analog node 16 (i.e. the voltage of VCTRL) is constrained so as to remain at a safe level which will not result in over-stressing the transistors and thus will not result in permanent damage due to burn-in.

Figure 3:
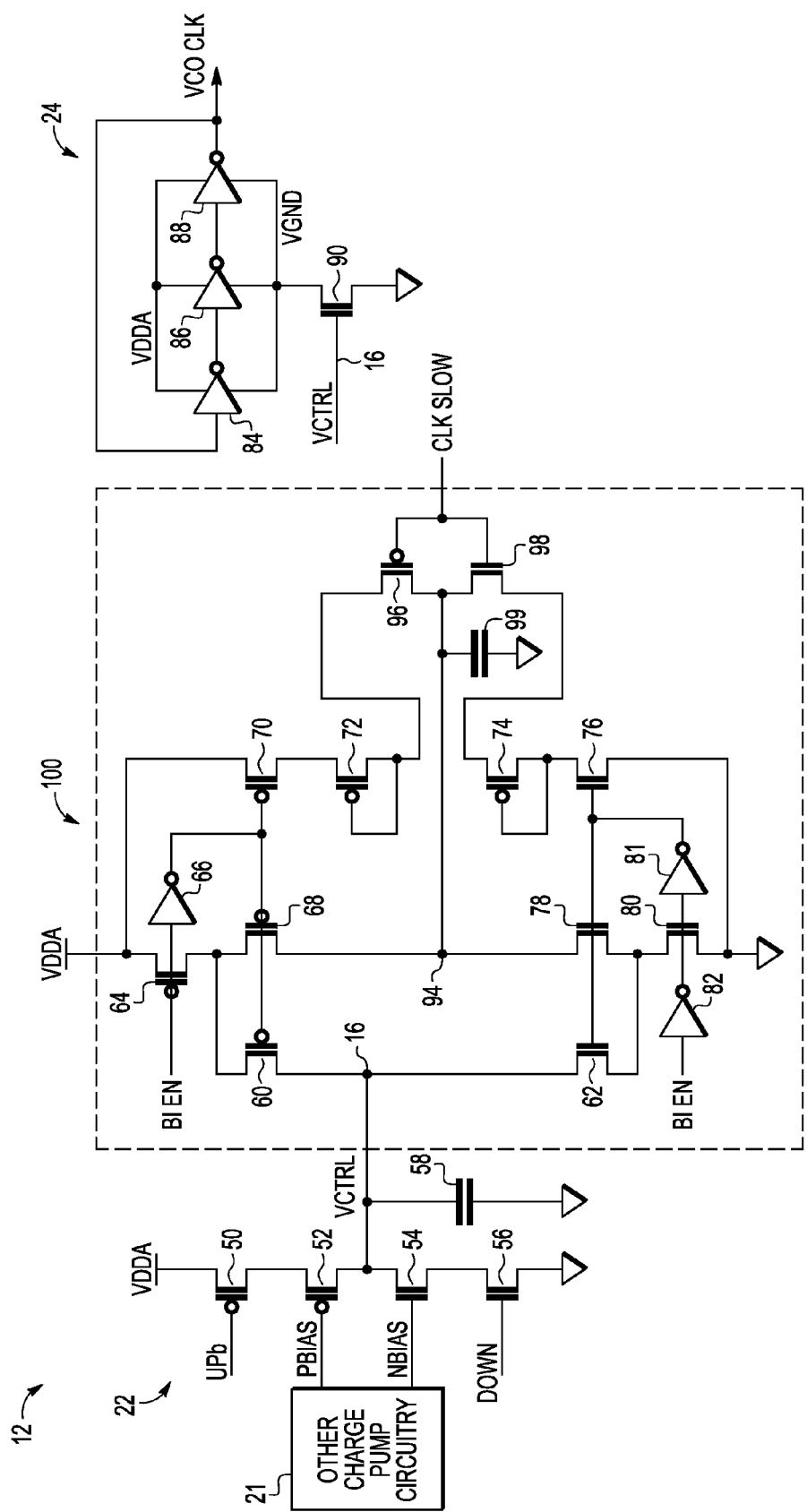
FIG. 3 is a schematic diagram of an portion of the of the PLL of FIG. 1, in accordance with another embodiment of the present disclosure.

In alternate embodiments, other types of circuitry may be used to ensure that analog node 16 remain sufficiently below the voltage of VDDA during burn-in so as to avoid the over-stressing of transistors. Furthermore, the voltage at analog node 16 may not be held at a fixed value during burn-in. In one embodiment, the voltage of node 16 (VCTRL) may vary between an allowable range of voltage that is between VDDA and ground. For example, FIG. 3 illustrates, in schematic form, analog portion 12 in accordance with another embodiment of the present disclosure in which the node control circuit ramps VCTRL at analog node 16 during burn-in. In the embodiment of FIG. 3, a node control circuit 100 is used to control the voltage (VCTRL) at analog node 16 to remain sufficiently below a voltage of the higher VDDA during burn-in so as to avoid over-stressing charge pump 22 and VCO 24. Note that like reference numerals between FIGS. 2 and 3 indicate like elements.

Referring to FIG. 3, node control circuit 100 includes many similar elements to node control circuit 23 and further includes a P-channel transistor 96 having a first current electrode coupled to the second current electrode of transistor 72, a control electrode coupled to receive a clock signal, shown as CLK SLOW, and a second current electrode coupled to a circuit node 94, and an N-channel transistor 98 having a first current electrode coupled to circuit node 94, a control electrode coupled to receive CLK SLOW, and a second current electrode coupled to the first current electrode of transistor 74. Node control circuit 100 also includes a capacitor 99 having a first terminal coupled to node 94 and a second terminal coupled to ground. In the embodiment of FIG. 3, circuit node 94 is coupled to the second current electrode of transistor 68 and the first current electrode of transistor 78, and similar to circuit node 92 of FIG. 2, circuit node 94 may be referred to as the control node which controls VCTRL at node 16. As with FIG. 2, during normal mode in which BI EN is deasserted, transistors 60, 68, 70, 62, 78, and 67 are off, thus decoupling node control circuit 100 from node 16. However, during burn-in mode, in which BI EN is asserted, current paths are provided through circuit node 94, through transistors 68 and 78, and through transistors 60 and 62. As with FIG. 2, transistors 60 and 62 (and transistors 68 and 78) operate as a transmission gate coupled between analog node 16 and control node 94 and is response to BI EN. In the illustrated embodiment, during burn-in mode, current flows from VDDA through transistors 70, 72, and 96, as well as through transistor 98, 74, and 76 to ground. The control gates of transistors 96 and 98 receive CLK SLOW, which may be slower than any of the other clock signals in PLL 48 or in burn-in control logic 14. The frequency of CLK SLOW determines the ramp rate of node 94 between a maximum voltage that is between VDDA and VDDA/2 and a minimum voltage that is between VDDA/2 and ground. In this manner, by controlling the voltage at node 94, VCTRL at node 16, which is coupled to node 94 through the transmission gate formed by transistors 60, 62, 68, and 78 is likewise controlled.

Referring back to FIG. 1, PLL 48 also includes a digital portion which includes digital circuits (also referred to as logic circuits) which are powered by VDDL, and which may also be damaged due to the over-stressing during burn-in mode. For example, these digital circuits may include CLK receiver 18, PFD 20, feedforward frequency divider 26, and feedback frequency divider 28. During burn-in, VDDL is also set to a voltage value that is greater than the allowable voltage value of VDDL during normal operation. Also, during burn-in, if the digital circuits of PLL 48 hold a particular digital state for too long, certain devices may be over-stressed, thus resulting in permanent damage of the over-stressed devices. For example, if the inputs and outputs of a particular logic gate are held too long at a particular digital state, either the P channel devices or the N channel devices may be overly-stressed. This may change the operating characteristics of the logic gate. Therefore, it may be desirable to ensure that stress during burn-in mode is distributed among all P channel and N channel transistors within the digital circuits of PLL 48 to sufficiently identify defects but not overstressed to the point of creating defects by permanently damaging the transistors. Furthermore, it may desirable that stress during burn-in is distributed substantially equally between P-channel and N-channel devices. Therefore, in one embodiment, all digital portions of PLL 48, including dividers, MUXes, and other logic and clock paths, can be toggled and exercised as evenly as possible during burn-in to ensure balanced stress among transistors and avoid overstressing selected transistors.

For example, referring to FIG. 1, each bit of the control inputs of MUXes 30, 32, 34, and 36 are provided with toggling patterns to ensure that all digital circuit paths in PLL 48 gets exercised. For example, referring to FB SEL, it is desirable to ensure that any path responsive to selection of FB CLK EXT and any path responsive to the selection of FB CLK INT be exercised during burn-in. Therefore, during burn-in, when BI EN is asserted, MUX 40 of burn-in control logic 14 provides CLK1 to the control input of MUX 32 as FB SEL. In this manner, during burn-in mode, FB SEL will be constantly toggled, in accordance with CLK1, to ensure that each of FB CLK EXT and FB CLK INT gets selected and selected for a substantially equal amount of time during a burn-in session. Similarly, referring to FF DIV CLK SEL [0:1], it is desirable to ensure that any path responsive to selection of any of the inputs to MUX 34 be exercised during burn-in. Therefore, a toggling pattern can be provided for each bit of FF DIV SEL [0:1] to ensure that all 4 possible combinations of FF DIV SEL [0:1] are provided during burn-in. Therefore, during burn-in mode in which BI EN is asserted, MUX 42 of burn-in control logic 14 provides CLK1 to FF DIV CLK SEL [0] and CLK2 to FF DIV CLK SEL [1]. In one embodiment, CLK1 has twice the frequency of CLK2, and in this manner, by providing the two different frequency clock signals, CLK1 and CLK2, to the two bit control input of MUX 34, all possible combinations of FF DIV CLK SEL [0:1] will be provided: 00, 01, 10, and 11. For example, 00 will occur when both CLK1 and CLK2 are low, 01 will occur when CLK1 is low, but CLK2 is high, etc. Therefore, circuitry within burn-in control logic 14, such as CLK divider 38 and MUXes 40 and 42 (which are responsive to BI EN) can be used to provide toggling patterns to each of the MUX control inputs of PLL 48 during burn-in to ensure that a particular digital state is not held too long during burn-in, and to distribute the stress applied during burn-in to all P-channel and N-channel transistors of the digital logic. Furthermore, the clocks used to generate these patterns, such as CLK1, CLK2, CLK3, and CLK4 may be selected so as to evenly distribute the stress applied during burn-in between the N-channel and P-channel devices.

Furthermore, it may be possible for PLL 48 to be in other modes while in burn-in mode. For these other modes, when not in burn-in mode, different control signals may be provided to various portions of PLL 48, including to MUXes 30, 32, 34, and 36. However, in one embodiment, if burn-in mode occurs while another of these modes is occurring (or if another of these modes is attempted during burn-in mode), PLL 48 may be placed into the conditions of burn-in mode in which BI EN is used to configure both burn-in control logic 14 and node control circuit 23 or 100, regardless of the settings needed for the other modes. That is, the configurations responsive to BI EN override any other lower priority modes of PLL 48 during burn-in.

Therefore, by now it can be appreciated how a PLL can be configured during burn-in so as to protect the transistors of the analog circuits from being overstressed. This may be done by controlling a voltage of an analog circuit node located between the charge pump and the VCO to remain either at a fixed voltage level or within a range of acceptable levels. Furthermore, through the use of the toggling signals generated by the burn-in control logic during burn-in, the digital circuits of a PLL can be appropriately stressed during burn-in sufficiently to identify defects but not over-stressed so as to create defects.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention is described herein with reference to specific embodiments, various modifications and changes can be made without departing from the scope of the present invention as set forth in the claims below. For example, the power supply voltages may be different than those chosen. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

Item 1 includes a phase locked loop having a normal mode and a burn-in mode and includes a logic portion coupled to a logic power supply terminal, the logic portion including a clock receiver coupled to a phase frequency detector; an analog portion having a charge pump coupled to the phase frequency detector and to an analog power supply terminal and having a voltage controlled oscillator coupled to the charge pump at an analog node and to the analog power supply terminal; and a node control circuit that is coupled to the analog node during the burn-in mode that controls a voltage at the analog node sufficiently below a voltage at the analog power supply terminal to avoid over-stressing the charge pump and the voltage controlled oscillator during the burn-in mode. Item 2 includes the phase locked loop of item 1, wherein the node control circuit ramps the voltage at the analog node during the burn-in mode. Item 3 includes the phase locked loop of item 1, wherein the node control circuit holds the voltage at the analog node at a fixed voltage during the burn-in mode. Item 4 includes the phase locked loop of item 3, wherein the fixed voltage is one half the voltage at the analog power supply terminal. Item 5 includes the phase locked loop of item 4, wherein the node control circuit comprises a voltage divider that provides the fixed voltage to a control node in response to a burn-in signal. Item 6 includes the phase locked loop of item 5, wherein the node control circuit further comprises a transmission gate coupled between the analog node and the control node that is enabled in response to the burn-in signal. Item 7 includes the phase locked loop of item 1, wherein the logic portion further comprises a feedforward frequency divider coupled to the logic power supply terminal having an input coupled to an output of the voltage controlled oscillator and an output coupled to an input of the clock receiver. Item 8 includes the phase locked loop of item 7, wherein the logic portion includes N channel transistors and P channel transistors, and further including burn-in control logic coupled to the clock receiver for ensuring that stress during the burn-in mode is distributed among all of the N channel transistors and P channel transistors so that all of the N channel transistors and P channel transistors are stressed sufficiently to identify defects but not over-stressed to create defects. Item 9 includes the phase locked loop of item 8, wherein the logic portion further includes a feedback frequency divider coupling the output of the feedforward frequency divider to the input of the clock receiver wherein the burn-in control logic is further characterized as being coupled to the feedback frequency divider. Item 10 includes the phase locked loop of item 9, wherein the logic portion further includes a multiplexer coupled between the feedback frequency divider and the clock receiver having a first input coupled to an output of the feedback frequency divider, a second input for receiving an external clock signal, an output coupled to the clock receiver, and a select terminal coupled to the burn-in control logic.

Item 11 includes a method of operating a phase locked loop, including, during a normal mode of operation: providing a clock output from a logic portion of the phase locked loop responsive to an analog portion which includes a voltage controlled oscillator and a charge pump, wherein the analog portion is coupled to an analog power supply terminal that is for receiving a voltage for powering the analog portion; providing feedback from the clock output to a clock receiver of the phase locked loop, wherein the clock receiver is in the logic portion of the phase locked loop; providing a reference clock to the clock receiver; providing an output from the clock receiver to an input of a phase frequency detector of the phase locked loop, wherein the phase frequency detector is in the logic portion; providing up and down signals from the phase frequency detector to the charge pump; and providing a control signal from the charge pump to the voltage controlled oscillator at an analog node between the charge pump and the voltage controlled oscillator; and, in a burn-in mode of operation: controlling a voltage at the analog node, responsive to an output of a node control circuit being enabled by a burn-in signal, to ensure the voltage at the analog node is sufficiently below a level of the voltage at the analog power supply terminal to avoid damaging the analog portion. Item 12 includes the method of item 11, wherein the controlling the voltage is further characterized by the voltage at the analog node being ramped up and down within a predetermined range that ensures the voltage at the analog node is sufficiently below a level of the voltage at the analog power supply terminal to avoid damaging the analog portion. Item 13 includes the method of item 11, wherein the controlling the voltage in the burn-in mode is further characterized by the voltage at the analog node being fixed during the burn-in mode. Item 14 includes the method of item 13, wherein the controlling the voltage in the burn-in mode is further characterized by the voltage at the analog node being fixed at one half the voltage at the analog power supply terminal. Item 15 includes the method of item 14, wherein the controlling the voltage is by the node control circuit using a voltage divider to generate the voltage at the analog node. Item 16 includes the method of item 15, and further includes operating the logic portion in the burn-in mode to ensure that stress during the burn-in mode is distributed among transistors that comprise the logic portion so that all of the transistors are stressed sufficiently to identify defects but not overstressed to create defects. Item 17 includes the method of item 12, and further includes applying a higher voltage to the analog power supply terminal during the burn-in mode than during the normal mode.

Item 18 includes phase locked loop including a logic portion for receiving power from a logic power supply terminal at a first voltage level during a normal mode and at an elevated voltage level during a burn-in mode; an analog portion coupled to the logic portion having a charge pump and a voltage controlled oscillator, wherein the voltage controlled oscillator is coupled the charge pump at an analog node; and a node control circuit that is coupled to the analog node during the burn-in mode that controls a voltage at the analog node to avoid over-stressing the charge pump and the voltage controlled oscillator during the burn-in mode. Item 19 includes the phase locked loop of item 18, wherein the node control circuit ramps the voltage at the analog node during the burn-in mode. Item 20 includes the phase locked loop of item 18, wherein the node control circuit holds the voltage at the analog node at a fixed level during the burn-in mode.

What is claimed is:

1. A phase locked loop having a normal mode and a burn-in mode, comprising:
    a logic portion coupled to a logic power supply terminal, the logic portion including a clock receiver coupled to a phase frequency detector;
    an analog portion having a charge pump coupled to the phase frequency detector and to an analog power supply terminal and having a voltage controlled oscillator coupled to the charge pump at an analog node and to the analog power supply terminal; and
    a node control circuit that is coupled to the analog node during the burn-in mode that controls a voltage at the analog node sufficiently below a voltage at the analog power supply terminal to avoid over-stressing the charge pump and the voltage controlled oscillator during the burn-in mode, wherein the node control circuit holds the voltage at the analog node at a fixed voltage during the burn-in mode, wherein the node control circuit comprises a voltage divider that provides the fixed voltage to a control node in response to a burn-in signal, wherein the fixed voltage is between the voltage at the analog power supply terminal and ground, and wherein the node control circuit further comprises a transmission gate coupled between the analog node and the control node that is enabled in response to the burn-in signal,
    wherein the phase locked loop has a scan test mode and further comprises burn-in control logic coupled to the logic portion for ensuring that the burn-in mode takes priority over the scan test mode.

2. The phase locked loop of claim 1, wherein the fixed voltage is one half the voltage at the analog power supply terminal.

3. The phase locked loop of claim 1, wherein the logic portion further comprises a feedforward frequency divider coupled to the logic power supply terminal having an input coupled to an output of the voltage controlled oscillator and an output coupled to an input of the clock receiver.

4. The phase locked loop of claim 3, wherein the logic portion comprises N channel transistors and P channel transistors, further comprising burn-in control logic coupled to the clock receiver for ensuring that stress during the burn-in mode is distributed among all of the N channel transistors and P channel transistors so that all of the N channel transistors and P channel transistors are stressed sufficiently to identify defects but not overstressed to create defects.

5. The phase locked loop of claim 4, wherein the logic portion further comprises a feedback frequency divider coupling the output of the feedforward frequency divider to the input of the clock receiver wherein the burn-in control logic is further characterized as being coupled to the feedback frequency divider.

6. The phase locked loop of claim 5, wherein the logic portion further comprises a multiplexer coupled between the feedback frequency divider and the clock receiver having a first input coupled to an output of the feedback frequency divider, a second input for receiving an external clock signal, an output coupled to the clock receiver, and a select terminal coupled to the burn-in control logic.

7. The phase locked loop of claim 1, further comprising burn-in control logic coupled to the logic portion for ensuring that stress during the burn-in mode is distributed among all N channel transistors and P channel transistors of the logic portion so that all of the N channel transistors and P channel transistors are stressed sufficiently to identify defects but not overstressed to create defects.

8. A method of operating a phase locked loop, comprising:
    during a normal mode of operation:
        providing a clock output from a logic portion of the phase locked loop responsive to an analog portion which includes a voltage controlled oscillator and a charge pump, wherein the analog portion is coupled to an analog power supply terminal that is for receiving a voltage for powering the analog portion;
        providing feedback from the clock output to a clock receiver of the phase locked loop, wherein the clock receiver is in the logic portion of the phase locked loop;
        providing a reference clock to the clock receiver;
        providing an output from the clock receiver to an input of a phase frequency detector of the phase locked loop, wherein the phase frequency detector is in the logic portion;
        providing up and down signals from the phase frequency detector to the charge pump; and
        providing a control signal from the charge pump to the voltage controlled oscillator at an analog node between the charge pump and the voltage controlled oscillator; and
    in a burn-in mode of operation:
        controlling a voltage at the analog node, responsive to an output of a node control circuit being enabled by a burn-in signal, to ensure the voltage at the analog node is sufficiently below a level of the voltage at the analog power supply terminal to avoid damaging the analog portion, wherein the controlling the voltage in the burn-in mode is further characterized by the voltage at the analog node being fixed during the burn-in mode at a voltage level that is between ground and the voltage of the analog power supply terminal, wherein the controlling the voltage is by the node control circuit using a voltage divider to generate the voltage at the analog node;
        operating the logic portion in the burn-in mode to ensure that stress during the burn-in mode is distributed among transistors that comprise the logic portion so that all of the transistors are stressed sufficiently to identify defects but not overstressed to create defects; and
        when a scan test mode indicator is asserted, ensuring that the burn-in mode takes priority over the scan test mode.

9. The method of claim 8, wherein the controlling the voltage in the burn-in mode is further characterized by the voltage at the analog node being fixed at one half the voltage at the analog power supply terminal.

10. The method of claim 8, further comprising applying a higher voltage to the analog power supply terminal during the burn-in mode than during the normal mode.

11. A phase locked loop comprising:
- a logic portion for receiving power from a logic power supply terminal at a first voltage level during a normal mode and at an elevated voltage level during a burn-in mode, wherein the logic portion comprises N channel transistors and P channel transistors;
- an analog portion coupled to the logic portion having a charge pump and a voltage controlled oscillator, wherein the voltage controlled oscillator is coupled the charge pump at an analog node;
- a node control circuit that is coupled to the analog node during the burn-in mode that controls a voltage at the analog node to avoid over-stressing the charge pump and the voltage controlled oscillator during the burn-in mode, wherein the node control circuit includes a voltage divider that holds the voltage at the analog node at a fixed level between ground and the voltage at the analog power supply terminal during the burn-in mode; and
- burn-in control logic coupled to the logic portion for ensuring that stress during the burn-in mode is distributed among all of the N channel transistors and P channel transistors so that all of the N channel transistors and P channel transistors are stressed sufficiently to identify defects but not overstressed to create defects,
- wherein the phase locked loop has a scan test mode and the burn-in logic ensures that the burn-in mode takes priority over the scan test mode.

* * * * *